(12) United States Patent
Takahashi

(10) Patent No.: US 8,411,057 B2
(45) Date of Patent: Apr. 2, 2013

(54) PROTECTION-PLATE-ATTACHED ELECTRONIC MEMBER

(75) Inventor: Masayuki Takahashi, Asaka (JP)

(73) Assignee: Casio Computer Co., Ltd., Tokyo (JP)

( * ) Notice: Subject to any disclaimer, the term of this patent is extended or adjusted under 35 U.S.C. 154(b) by 469 days.

(21) Appl. No.: 12/833,015

(22) Filed: Jul. 9, 2010

(65) Prior Publication Data

US 2011/0012852 A1   Jan. 20, 2011

(30) Foreign Application Priority Data

Jul. 14, 2009   (JP) ................................. 2009-165187

(51) Int. Cl.
*G06F 3/041* (2006.01)
(52) U.S. Cl. .......... 345/173; 345/104; 345/206; 349/96; 349/122; 156/330
(58) Field of Classification Search .................... 345/30, 345/87–89, 173–176, 205–206, 104; 178/18.01–18.09; 349/96, 122; 156/330, 156/526
See application file for complete search history.

(56) References Cited

U.S. PATENT DOCUMENTS

| 8,087,967 | B2 | 1/2012 | Shinya et al. | |
| 2007/0046873 | A1* | 3/2007 | Sakurai et al. | 349/122 |
| 2008/0100783 | A1* | 5/2008 | Bae | 349/96 |
| 2009/0086123 | A1* | 4/2009 | Tsuji et al. | 349/58 |
| 2009/0185100 | A1 | 7/2009 | Matsuhira et al. | |
| 2010/0245707 | A1* | 9/2010 | Harada | 349/58 |
| 2011/0007391 | A1* | 1/2011 | Takahashi | 359/485 |
| 2011/0043733 | A1* | 2/2011 | Suzuki et al. | 349/96 |
| 2011/0141409 | A1* | 6/2011 | Ashida | 349/96 |

FOREIGN PATENT DOCUMENTS

| JP | 5-339544 A | 12/1993 |
| JP | 11-174435 A | 7/1999 |
| JP | 2001-075494 A | 3/2001 |
| JP | 2005-099305 A | 4/2005 |

(Continued)

OTHER PUBLICATIONS

U.S. Appl. No. 12/830,549; First Named Inventor: Masayuki Takahashi; Title: "Display Apparatus With Protection Plate and Manufacturing Method Thereof"; filed Jul. 6, 2010.

(Continued)

*Primary Examiner* — Lun-Yi Lao
*Assistant Examiner* — Priyank Shah
(74) *Attorney, Agent, or Firm* — Holtz, Holtz, Goodman & Chick, P.C.

(57) ABSTRACT

A protection-plate-attached electronic member including: a first electronic member including a first transparent substrate; an adhesion layer which overlaps with the first transparent substrate; a protection plate fixed to the first electronic member in a state in which the adhesion layer intervenes between the protection plate and the first transparent substrate; and a peeling auxiliary section which intervenes between the adhesion layer and one of the protection plate and the first electronic member so as to lower bonding strength between the adhesion layer and the one of the protection plate and the first electronic member, wherein the adhesion layer includes an overlapping section which overlaps with the peeling auxiliary section; and a nonoverlapping section which does not overlap with the peeling auxiliary section and which directly contacts with the one of the protection plate and the first electronic member.

25 Claims, 10 Drawing Sheets

FOREIGN PATENT DOCUMENTS

| | | |
|---|---|---|
| JP | 2006-078929 A | 3/2006 |
| JP | 2007-093684 A | 4/2007 |
| JP | 2008-090053 A | 4/2008 |
| JP | 2009-122655 A | 6/2009 |

OTHER PUBLICATIONS

Japanese Office Action dated Apr. 12, 2011 (and English translation thereof) in counterpart Japanese Application No. 2009-165187.

* cited by examiner

PROTECTION-PLATE-ATTACHED ELECTRONIC MEMBER

CROSS-REFERENCE TO RELATED APPLICATIONS

This application is based upon and claims the benefit of priority under 35 USC 119 of Japanese Patent Application No. 2009-165187 filed on Jul. 14, 2009, the entire disclosure of which, including the description, claims, drawings, and abstract, is incorporated herein by reference in its entirety.

BACKGROUND OF THE INVENTION

1. Field of the Invention

The present invention relates to a protection-plate-attached electronic member.

2. Description of the Related Art

There is conventionally known a protection-plate-attached electronic member, for example, as disclosed in Japanese Patent Application Laid-Open Publication No. 2008-90053, the protection-plate-attached electronic member in which a protection plate is arranged on a side of the front surface of a display panel, and the protection plate and the display panel are bonded to each other for protecting the display panel. It is necessary for such a protection-plate-attached electronic member that both of the protection plate and the display panel are firmly fixed to each other lest the protection plate and the display panel be easily separated from each other at the time of use. Hence, a bonding agent which is cured after bonding (for example, UV-curable resin or heat-curable resin), an adhesive compound which resists peeling without causing transformation of its state even after bonding, or the like is used for firmly fixing the display panel and the protection plate to each other lest they be easily separated from each other.

In a case where an alien substance, an air bubble, or the like enters into a gap between the display panel, which forms a screen area, and the protection plate after the display panel and the protection plate are bonded together, the protection-plate-attached electronic member is judged as an inferior good. However, because the joining strength between the display panel and the protection plate through the bonding agent or the adhesive compound is high, the display panel and the protection plate cannot be peeled from each other, and consequently it is a fact that the protection-plate-attached electronic member is obliged to be abandoned after all.

BRIEF SUMMARY OF THE INVENTION

According to an aspect of the present invention, there is provided a protection-plate-attached electronic member including: a first electronic member including a first transparent substrate; an adhesion layer which overlaps with the first transparent substrate; a protection plate fixed to the first electronic member in a state in which the adhesion layer intervenes between the protection plate and the first transparent substrate; and a peeling auxiliary section which intervenes between the adhesion layer and one of the protection plate and the first electronic member so as to lower bonding strength between the adhesion layer and the one of the protection plate and the first electronic member, wherein the adhesion layer includes an overlapping section which overlaps with the peeling auxiliary section; and a nonoverlapping section which does not overlap with the peeling auxiliary section and which directly contacts with the one of the protection plate and the first electronic member.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 2A and 2B are explanatory views showing a water repellent agent applying process of a manufacturing method of the protection-plate-attached electronic member according to the first embodiment of the present invention, in which FIG. 2A is a sectional view taken along the cutting-plane line IIA-IIA in FIG. 2B, and FIG. 2B is a sectional view taken along the cutting-plane line IIB-IIB in FIG. 2A;

FIGS. 3A and 3B are explanatory views showing a water repellent agent removing process of the manufacturing method of the protection-plate-attached electronic member according to the first embodiment of the present invention, in which FIG. 3A is a sectional view taken along the cutting-plane line IIIA-IIIA in FIG. 3B, and FIG. 3B is a sectional view taken along the cutting-plane line IIIB-IIIB in FIG. 3A;

FIGS. 4A and 4B are explanatory views showing a adhesion layer forming process of the manufacturing method of the protection-plate-attached electronic member according to the first embodiment of the present invention, in which FIG. 4A is a sectional view taken along the cutting-plane line IVA-IVA in FIG. 4B, and FIG. 4B is a sectional view taken along the cutting-plane line IVB-IVB in FIG. 4A;

FIGS. 5A and 5B are explanatory views showing a bonding process of the manufacturing method of the protection-plate-attached electronic member according to the first embodiment of the present invention, in which FIG. 5A is a sectional view taken along the cutting-plane line VA-VA in FIG. 5B, and FIG. 5B is a sectional view taken along the cutting-plane line VB-VB in FIG. 5A;

FIGS. 7A and 7B are explanatory views showing the schematic configuration of the protection-plate-attached electronic member according to a third embodiment of the present invention, in which FIG. 7A is a sectional view taken along the cutting-plane line VIIA-VIIA in FIG. 7B, and FIG. 7B is a sectional view taken along the cutting-plane line VIIB-VIIB in FIG. 7A;

FIGS. 8A and 8B are explanatory views showing the schematic configuration of the protection-plate-attached electronic member according to a modification of the third embodiment, in which FIG. 8A is a sectional view taken along the cutting-plane line VIIIA-VIIIA in FIG. 8B, and FIG. 8B is a sectional view taken along the cutting-plane line VIIIB-VIIIB in FIG. 8A;

DETAILED DESCRIPTION OF THE INVENTION

Embodiments of the present invention will be explained with reference to the drawings.

In the following, the best mode for implementing the present invention is described by using the drawings. Although technically preferable various limitations to implement the present invention are attached to the embodiments described below, the scope of the invention is not limited to the following embodiments and the drawings.

[First Embodiment]

Figure 1:
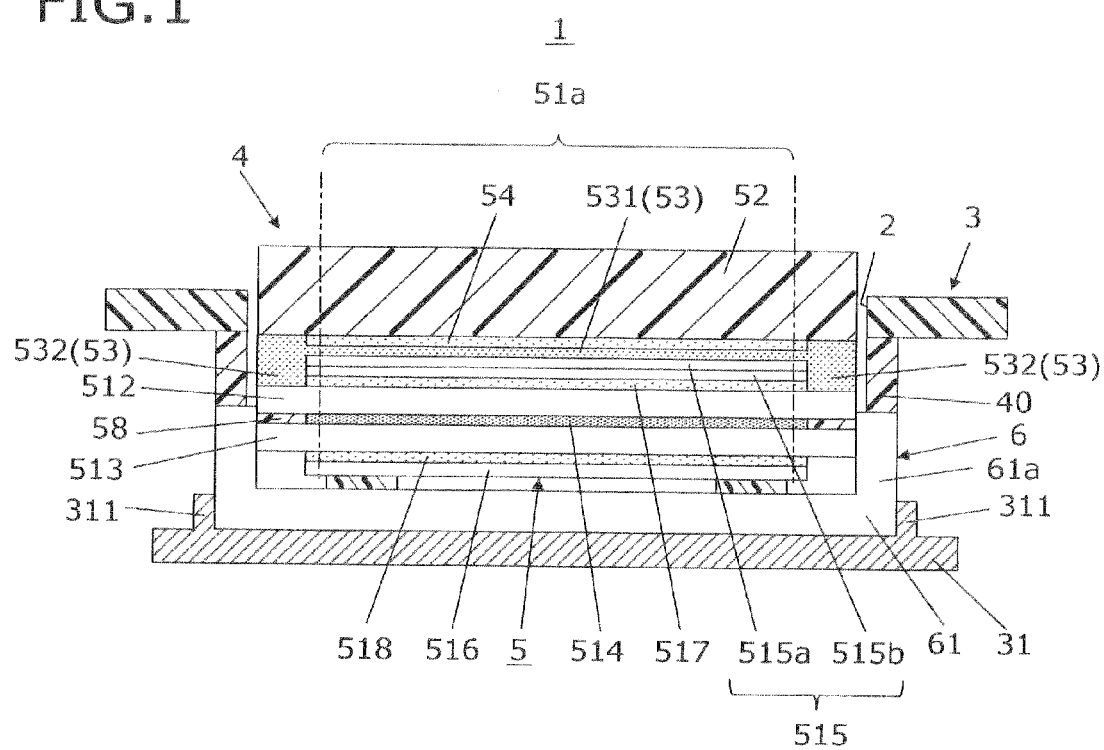
FIG. 1 is a sectional view showing the schematic configuration of an electronic apparatus in which a protection-plate-attached electronic member according to a first embodiment of the present invention is mounted.

FIG. 1 is a sectional view showing the schematic configuration of an electronic apparatus, in which a protection-plate-attached electronic member according to a first embodiment of the present invention is mounted. An electronic apparatus 1 is a cellular phone handset, a digital camera, an electronic organizer, or the like. As shown in FIG. 1, the electronic apparatus 1 is equipped with a housing 3 including a displaying aperture 2 of a predetermined size, and a liquid crystal display module 4 housed in the housing 3 so as to correspond to the aperture 2.

The liquid crystal display module 4 includes a protection-plate-attached electronic member 5 and a surface light source unit 6 as a surface light source radiating an irradiating light to the protection-plate-attached electronic member 5. In the following, of sides of the protection-plate-attached electronic member 5, a side thereof on which the surface light source unit 6 is arranged (the lower side in FIG. 1) is called a "back side", and a side thereof opposite to the back side (the upper side in FIG. 1) is called "observation side". Accordingly, of a pair of transparent substrates 512 and 513, the transparent substrate 512 (second transparent substrate) is on the observation side, and the transparent substrate 513 (first transparent substrate) is on the back side.

In the following, the protection-plate-attached electronic member 5 is described in detail. As shown in FIG. 1, the protection-plate-attached electronic member 5 includes a liquid crystal display panel 51, which is a display panel displaying images, as a first electronic member, an adhesion layer 53 superposed on the liquid crystal display panel 51 so as to cover the whole of a screen area 51a of the liquid crystal display panel 51, and the protection plate 52 arranged on an observation side surface of the liquid crystal display panel 51 by the adhesion layer 53.

The liquid crystal display panel 51 includes the pair of transparent substrates 512 and 513 arranged on the observation side and the back side, respectively, opposing to each other with a predetermined gap therebetween; a liquid crystal layer 514 sealing the gap between the transparent substrates 512 and 513; a first and a second transparent electrodes (not shown) for forming a plurality of pixels which controls light transmission by changing the orientational state of liquid crystal molecules of the liquid crystal layer 514 by applying a voltage, the first and the second transparent electrodes being formed on the inner surfaces, opposite to each other, of the pair of transparent substrates 512 and 513, respectively; and an optical sheet 515 bonded to an outer surface of the transparent substrate 512 on the observation side with an optical-sheet adhesive compound 517; and a polarizing plate 516 bonded to an outer surface of the transparent substrate 513 on the back side with a polarizing-plate adhesive compound 518.

The liquid crystal display panel 51 is composed of active matrix liquid crystal display elements using thin film transistors (TFTs) as active elements. Although not shown in the drawings, the inner surface of one transparent substance (for example, the transparent substrate 513 on the back side) of the pair of transparent substrates 512 and 513 is provided with a plurality of pixel electrodes (first electrodes) formed in a matrix, namely, arranged in the row direction and the column direction; a plurality of TFTs arranged to correspond to the plurality of pixel electrodes, respectively, and connected to the corresponding pixel electrodes, respectively; a plurality of scanning lines, each supplying gate signals to the plurality of TFTs, respectively, in each row; and a plurality of signal lines, each supplying data signals to the plurality of TFTs, respectively, in each column. On the other hand, the inner surface of the other transparent substrate (for example, the transparent substrate 512 on the observation side) is provided with a counter electrode (second electrode) formed to be opposed to the whole of a region where the plurality of pixel electrodes is arranged; and color filters of three colors of red, green, and blue, each of the color filters formed to correspond to each of a plurality of pixels, each of which is composed of a region where the plurality of pixel electrodes and the counter electrode are mutually opposed.

The pair of transparent substrates 512 and 513 is joined together by a frame-shaped seal material 58 enclosing the screen area 51a, in which a plurality of pixels is arranged in a matrix. The liquid crystal layer 514 seals a region enclosed by the seal material 58 which is arranged between the transparent substrates 512 and 513. Furthermore, oriented films (not shown) covering the electrodes are formed on the inner surfaces of the pair of transparent substrates 512 and 513, respectively, and the liquid crystal molecules of the liquid crystal layer 514 are oriented by maintaining the initial orientational state owing to the oriented films.

The liquid crystal display panel 51 may be any of a twisted nematic (TN) type and a super twisted nematic (STN) type liquid crystal display panel, in which liquid crystal molecules are oriented to be twisted between the pair of transparent substrates 512 and 513; a perpendicular orientation type liquid crystal display panel, in which liquid crystal molecules are oriented substantially perpendicularly to the transparent substrates 512 and 513; a non-twisted horizontal orientation type liquid crystal display panel, in which liquid crystal molecules are arranged into one direction to be oriented to be substantially parallel to the inner surfaces of the transparent substrates 512 and 513; a bend orientation type liquid crystal display panel, in which liquid crystal molecules are oriented to be bent; and the like. In addition, the liquid crystal display panel 51 may be a ferroelectric or an anti-ferroelectric liquid crystal display panel.

The liquid crystal display panel 51 is provided with the plurality of pixel electrodes on the inner surface of the transparent substrate 513 on the back side and the counter electrode on the inner surface of the transparent substrate 512 on the observation side. Instead, for example, a lateral field control type liquid crystal display panel may be adopted as the liquid crystal display panel 51. The lateral field control type liquid crystal display panel is provided with, on the inner surface of one of the pair of transparent substrates 512 and 513, a plurality of first electrodes for forming a plurality of pixels arranged in a matrix; and provided with, on a side closer to the liquid crystal layer 514 or to the one of the pair of transparent substrates 512 and 513 from the plurality of first electrodes, a second electrode including a plurality of elongated electrode parts, the second electrode formed to be insulated from the plurality of first electrodes; a plurality of TFTs arranged to correspond to the plurality of first electrodes, respectively, and connected to the corresponding first electrodes, respectively; a plurality of scanning lines, each supplying gate signals to the plurality of TFTs, respectively, in each row; and a plurality of signal lines, each supplying data signals to the plurality of TFTs, respectively, in each column. The lateral field control type liquid crystal display panel thereby generates a lateral electric field (electric field in the direction along a substrate surface) between the plurality of first electrodes and the second electrode to change the orientational state of liquid crystal molecules thereof.

The optical sheet 515 is composed of a polarizing plate (hereinafter referred to as an observation-side polarizing plate) 515a with a polarizing layer put between protection films, and a phase plate 515b laminated on a surface of the observation-side polarizing plate 515a, the surface which is opposed to the transparent substrate 512 on the observation side, in order to improve the view angle characteristic and the like of the liquid crystal display panel 51. The optical sheet 515 is formed in a shape of a near-rectangle, is formed smaller than the transparent substrate 512 on the observation side and larger than the screen area 51a, and is bonded to a region of the transparent substrate 512, the region except for the periphery thereof, in order not to overlap with the periphery thereof. The polarizing plate 516 is formed in the substantially same shape as the shape of the optical sheet 515, and is bonded to a region of the transparent substrate 513 on the back side, the region except for the periphery thereof.

The protection plate 52 is made of tempered glass or a transparent resin plate having high strength. As the transparent resin having high strength, for example, acrylic, polycarbonate, and the like can be given. The protection plate 52 is formed in a size to cover the whole of the transparent substrate 512 on the observation side of the liquid crystal display panel 51. To put it concretely, the protection plate 52 is formed in the size larger than the transparent substrate 512 on the observation side of the liquid crystal display panel 51, and is arranged to be opposed to the outer surface of the optical sheet 515 (a surface on the observation side of the outer surfaces of the polarizing plate 515a) and the outer surface of the periphery of the transparent substrate 512, the periphery exposed from the optical sheet 515.

The adhesion layer 53 is made of, for example, an adhesive compound, such as slightly adhesive silicon or a fluorine compound, and is formed in a shape of a rectangle viewed from the front thereof. The adhesive compound is a soft solid in gel at the time of bonding, and resists peeling without causing transformation of a state thereof even after bonding. The adhesion layer 53 is arranged on the observation side surface of the liquid crystal display panel 51 to intervene between the liquid crystal display panel 51 and the protection plate 52. To put it concretely, the adhesion layer 53 covers the outer surface of the optical sheet 515 and a part of the outer surface of the periphery of the transparent substrate 512, the periphery which is exposed from the optical sheet 515. Hereby, the periphery of the adhesion layer 53 is arranged between the transparent substrate 512 on the observation side and the protection plate 52 to directly contact with both of the transparent substrate 512 on the observation side and the protection plate 52.

A peeling auxiliary section 54 made of a material whose bonding strength to the protection plate 52 is lower than the bonding strength of the adhesive compound constituting the adhesion layer 53 to the protection plate 52 intervenes between the adhesion layer 53 and the protection plate 52, and is arranged to be opposed to the liquid crystal display panel 51 through the adhesion layer 53. As the material of the peeling auxiliary section 54, for example, a water repellent agent and a mold releasing agent can be given. Concretely, it is preferable that the bonding strength of the adhesive compound constituting the adhesion layer 53 to the protection plate 52 be within a range from 10 N/2.5 cm to 100 N/2.5 cm, and the bonding strength of the adhesive compound constituting the peeling auxiliary section 54 to the protection plate 52 is within the range from 0.01 N/2.5 cm to 1 N/2.5 cm. Furthermore, it is preferable that the bonding strength between the adhesive compound constituting the adhesion layer 53 and the adhesive compound constituting the peeling auxiliary section 54 be lower than the bonding strength between the adhesive compound constituting the adhesion layer 53 and the protection plate 52. A material having the same light refraction index is used for the peeling auxiliary section 54 and the adhesion layer 53. The values of the bonding strength of the adhesion layer 53 or the bonding layer (peeling auxiliary section) 54 to an adherend and the joining strength between adherends in the present description are measured in conformity with "Test Method of Peel Strength of Adhesive-Part 3: T-Peeling (K6854-3)" or "Test Method of Cleavage Strength of Adhesive (K6853)" in the Japanese Industrial Standard (JIS) depending on the properties of the adherends.

In the following, a part of the adhesion layer 53, the part which overlaps with the peeling auxiliary section 54 (the region being inside a dotted line part in FIG. 5B) is referred to as an overlapping section 531, and a part of the adhesion layer 53, the part which does not overlap with the peeling auxiliary section 54 (the region being outside the dotted line part in FIG. 5B) is referred to as a nonoverlapping section 532. The nonoverlapping section 532 is formed in a shape of a frame on the periphery of the adhesion layer 53, and includes the whole of the outer periphery of the adhesion layer 53. The overlapping section 531 is formed in a region enclosed by the nonoverlapping section 532.

When the protection-plate-attached electronic member 5 is housed in the housing 3 in such a way that the protection plate 52 is arranged in the aperture 2 of the housing 3 as shown in FIG. 1, the surface light source unit 6 is arranged to be fixed to a supporting section 31 provided in the housing 3. A plurality of locating projections 311 coming into contact with the outer peripheral surface of a frame-shaped member 61 of the surface light source unit 6 is formed on the supporting section 31. Then, the frame-shaped member 61 of the surface light source unit 6 is fixed to the locating projections 311 by fixers such as screws.

A sealing frame 40 for preventing dust from entering the housing 3 through a gap between the peripheral surface of the aperture 2 and the outer peripheral surface of the protection plate 52 is provided between a peripheral wall section 61a of the frame-shaped member 61 of the surface light source unit 6 and the periphery of the aperture 2 of the housing 3. The sealing frame 40 is made of an elastic material such as sponge, and is sandwiched between opposite surfaces by bonding one surface of the sealing frame 40 to one of the opposite surfaces, which are the inner surface of the housing 3 and the top surface of the peripheral wall section 61a of the frame-shaped member 61, and by contacting the other surface of the sealing frame 40 to the other of the opposite surfaces, which are the inner surface of the housing 3 and the top surface of the peripheral wall section 61a of the frame-shaped member 61, in a state of being compressed to some extent.

Next, manufacturing processes of the electronic apparatus 1 are described. In the following, a case where the peeling auxiliary section 54 is made of a water repellent agent is described.

Figure 2A:
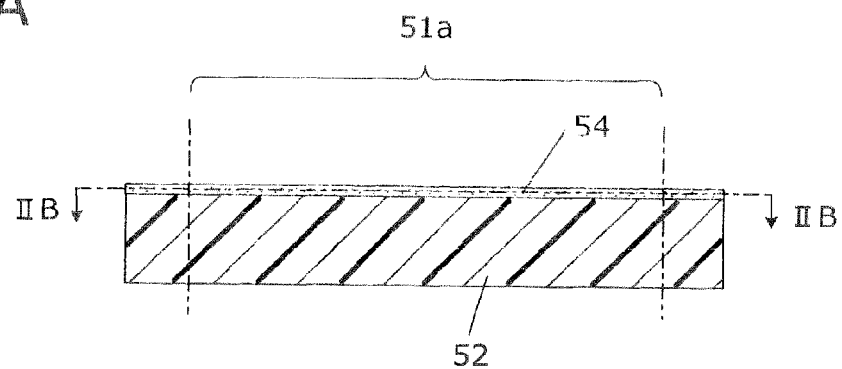
Figure 2B:
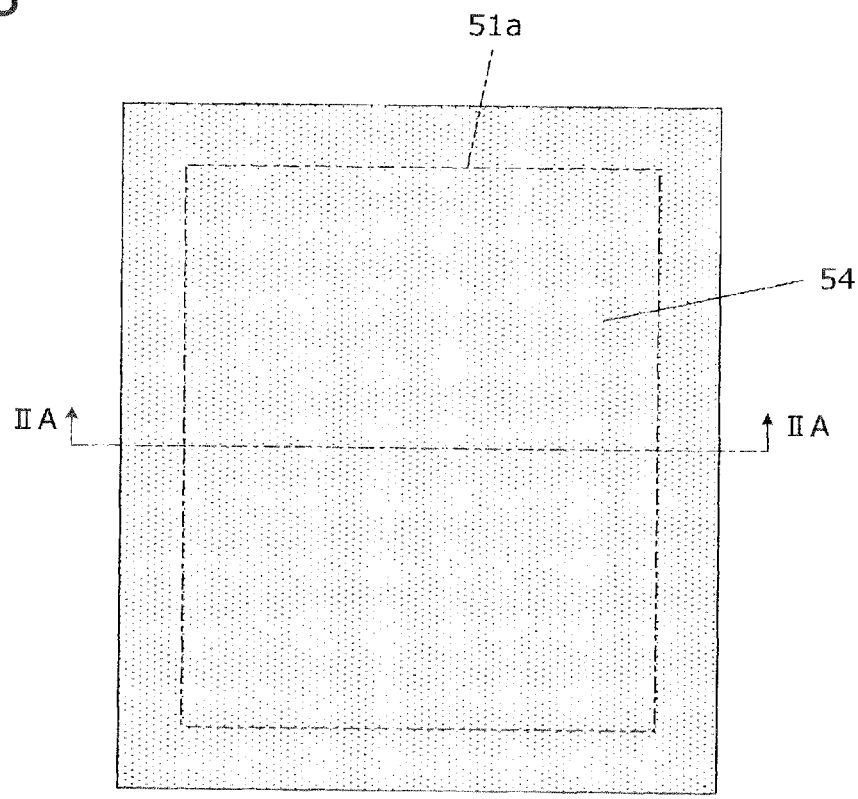

First, at the time of assembling the protection-plate-attached electronic member 5, wet cleaning or dry cleaning of the protection plate 52 is performed to clean the protection plate 52. Then, as shown in FIGS. 2A and 2B, a water repellent agent (for example, a silicide solution) is applied onto the whole of a surface of the protection plate 52, the surface which is opposed to the liquid crystal display panel 51, so as to form the peeling auxiliary section 54 (water repellent agent applying process).

Figure 3A:
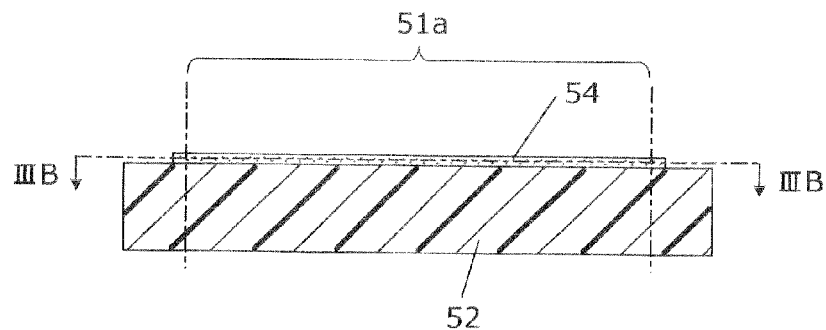
Figure 3B:
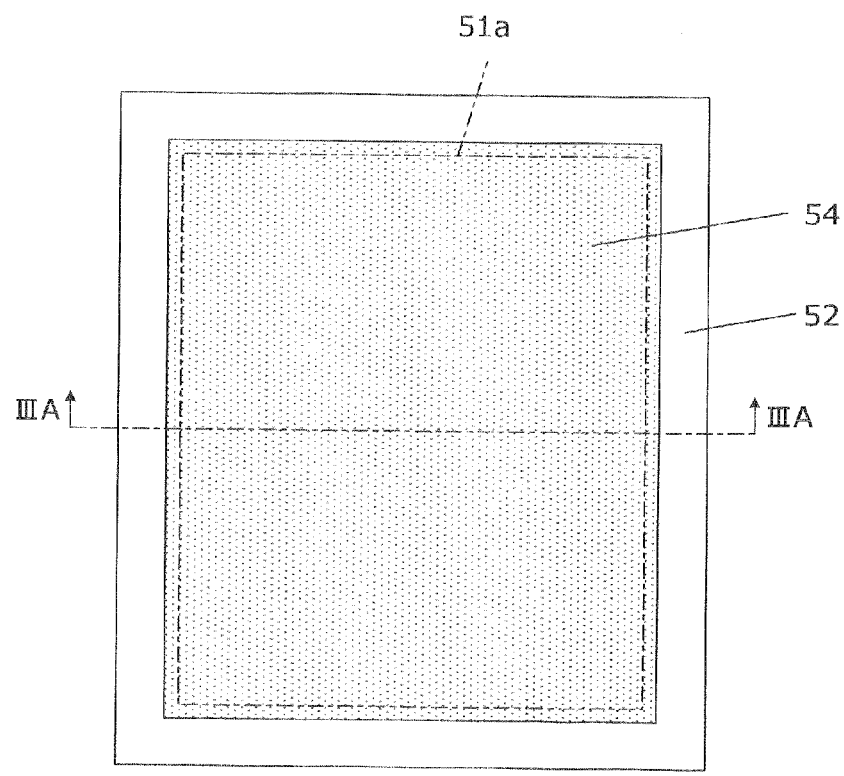

Next, the peeling auxiliary section 54 is covered with a metal mask in such a way that only the periphery of the peeling auxiliary section 54 is exposed, and is subjected to UV cleaning to remove the periphery of the peeling auxiliary section 54, namely to remove the water repellent agent on a part of the protection plate 52, the part corresponding to the periphery of the peeling auxiliary section 54 (water repellent agent removing process). Hereby, as shown in FIGS. 3A and 3B, the part of the protection plate 52, which corresponds to the periphery of the peeling auxiliary section 54, namely, corresponds to the neighboring part of the remaining peeling auxiliary section 54, is exposed, and the remaining part of the protection plate 52 is covered with the remaining peeling auxiliary section 54. Here, the water repellent agent is made to remain to overlap with the whole of the screen area 51a of the liquid crystal display panel 51. The part where the peeling auxiliary section 54 is removed so that the protection plate 52 is exposed corresponds to the nonoverlapping section 532 of the adhesion layer 53, and the part where the protection plate 52 is covered with the remaining peeling auxiliary section 54 corresponds to the overlapping section 531 of the adhesion layer 53. Consequently, the overlapping section 531 of the adhesion layer 53 overlaps with the whole of the screen area 51a of the liquid crystal display panel 51.

Figure 4A:
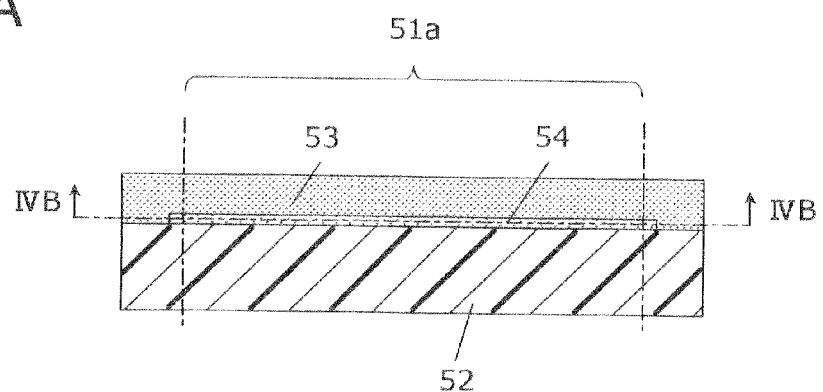
Figure 4B:
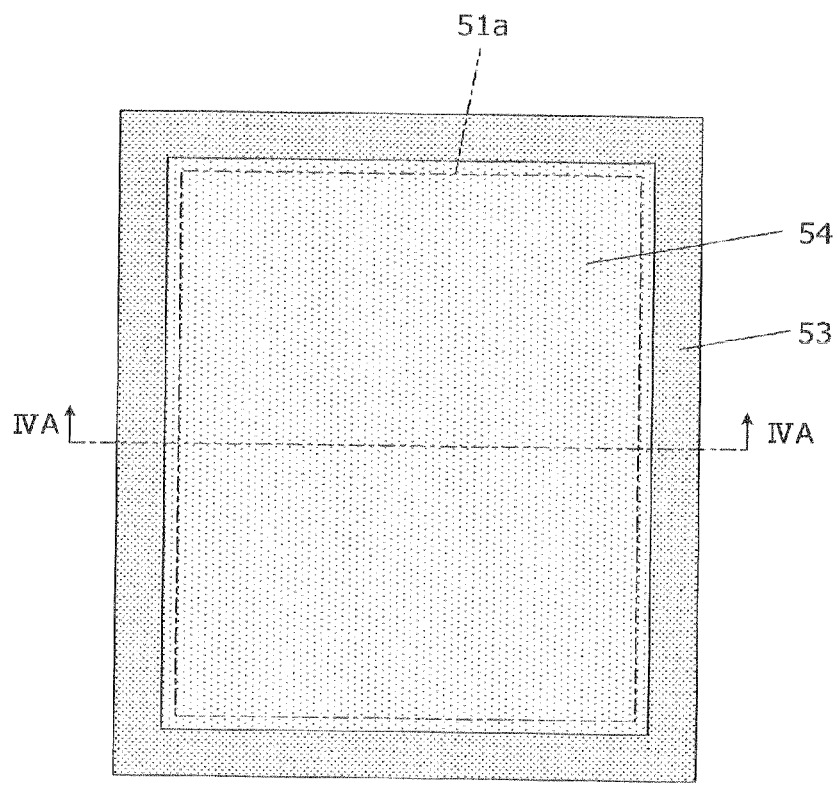

After that, as shown in FIGS. 4A and 4B, the adhesion layer 53 is formed on a surface of protection plate 52, the surface which is opposed to the liquid crystal display panel 51, so as to overlap with a part of the protection plate 52, the part which is exposed from the peeling auxiliary section 54, and with the whole of the peeling auxiliary section 54 (adhesion layer forming process). Before the formation, the adhesion layer 53 is formed in a form of a sheet in which the adhesion layer 53 is laminated on a release paper. The adhesion layer 53 is formed by bonding the sheet at a place to arrange the adhesion layer 53, and peeling the release paper thereof.

Figure 5A:
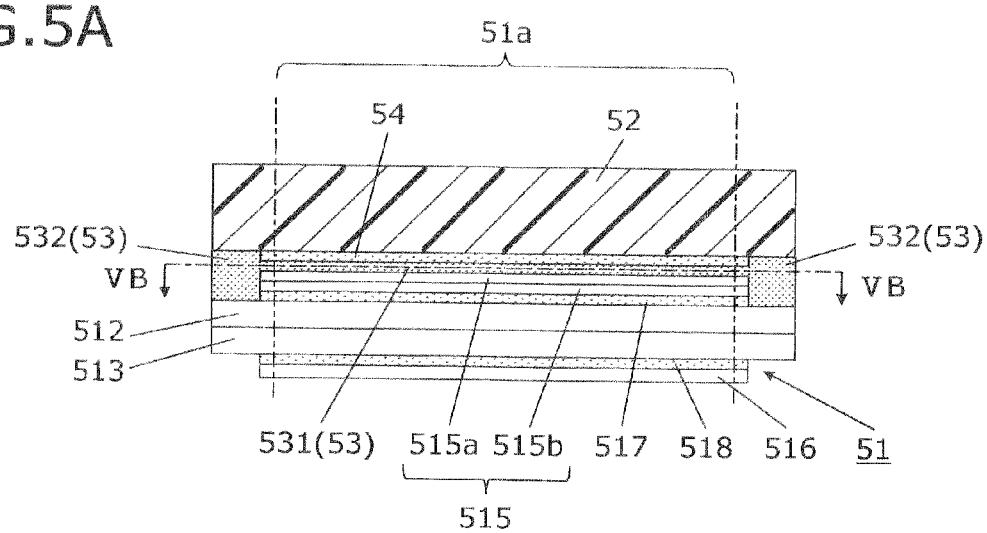
Figure 5B:
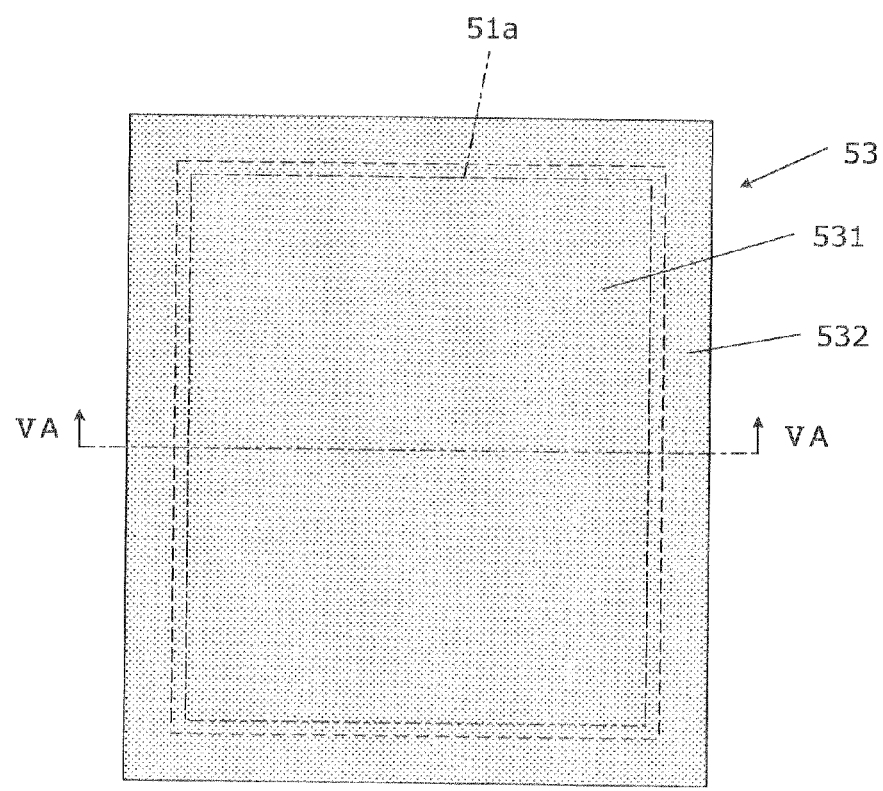

Next, as shown in FIGS. 5A and 5B, the protection plate 52 is vertically inverted, and the liquid crystal display panel 51 and the protection plate 52 are bonded together in a state in which the adhesion layer 53 and the peeling auxiliary section 54 intervene between the liquid crystal display panel 51 and the protection plate 52 so that the liquid crystal display panel 51 and the protection plate 52 are fixed (bonding process).

After the assembly of the protection-plate-attached electronic member 5, the protection-plate-attached electronic member 5 and the surface light source unit 6 are integrated to form the liquid crystal display module 4. To put it concretely, the periphery of the back side surface of the protection-plate-attached electronic member 5 is fixed to the inner bottom part of the surface light source unit 6 by a double-coated adhesive tape 66 so as to be integrated. Then, the liquid crystal display module 4 is housed in the housing 3 in such a way that the protection plate 52 of the liquid crystal display module 4 is arranged in the aperture 2 of the housing 3. At the time of housing, the sealing frame 40 is made to intervene between the peripheral wall section 61a of the frame-shaped member 61 of the surface light source unit 6 and the periphery of the aperture 2 of the housing 3. By fixing the frame-shaped member 61 of the surface light source unit 6 to the locating projections 311 of the housing 3, the assembly of the electronic apparatus 1 is completed.

As described above, according to the first embodiment of the present invention, the most past of the protection plate 52 directly contacts with the peeling auxiliary section 54, and the remaining part of the protection plate 52 directly contacts with the adhesion layer 53. In addition, the bonding strength between the protection plate 52 and the peeling auxiliary section 54 is lower than the bonding strength between the adhesion layer 53 and the peeling auxiliary section 54. Consequently, the joining strength between the liquid crystal display panel 51 and the protection plate 52 can be made to be lower in comparison with a case where the liquid crystal display panel 51 and the protection plate 52 are bonded together by contacting the whole of the protection plate 52 with the adhesion layer 53 directly. On the other hand, a part of the protection plate 52 contacts with the adhesion layer 53 directly, and the remaining part of the protection plate 52 contacts with the peeling auxiliary section 54 directly. In addition, the bonding strength between the protection plate 52 and the adhesion layer 53 is higher than the bonding strength between the protection plate 52 and the peeling auxiliary section 54. Consequently, the joining strength between the liquid crystal display panel 51 and the protection plate 52 can be made to be higher in comparison with a case where the liquid crystal display panel 51 and the protection plate 52 are bonded together by contacting the whole of the protection plate 52 with the peeling auxiliary section 54 directly. Therefore, for a case where the joining strength between the liquid crystal display panel 51 and the protection plate 52 is too high to peel from each other as needed at the time of manufacture because only the adhesion layer 53 intervenes therebetween, a protection-plate-attached electronic member can be provided by bonding the liquid crystal display panel 51 and the protection plate 52 with the peeling auxiliary section 54 and the adhesion layer 53, the electronic member with protection plate capable of setting the joining strength between the liquid crystal display panel 51 and the protection plate 52 lower in comparison with a case where only the adhesion layer 53 intervenes between the liquid crystal display panel 51 and the protection plate 52. By appropriately setting the joining strength, it is possible to provide a protection-plate-attached electronic member capable of firmly fixing the liquid crystal display panel 51 and the protection plate 52 to each other so as not to be easily separated at the time of use, and of peeling the liquid crystal display panel 51 and the protection plate 52 from each other as needed at the time of manufacture.

Moreover, because the adhesion layer 53 and the peeling auxiliary section 54 have the same refraction index, light is not refracted at the boundary between the adhesion layer 53 and the peeling auxiliary section 54, and consequently it is possible not to degrade the display quality of the liquid crystal display panel 51.

Furthermore, because the overlapping section 531 of the adhesion layer 53 overlaps with the whole of the screen area 51a of the liquid crystal display panel 51, the thickness of the adhesion layer 53 and the thickness of the peeling auxiliary section 54 can be made to be uniform at a part which is opposed to the screen area 51a. Hereby, the thickness does not change in a surface direction, so that it is possible not to degrade the display quality of the liquid crystal display panel 51.

[Second Embodiment]

Although the case of providing the protection plate 52 with the peeling auxiliary section 54 is illustrated in the first embodiment, a case of providing the liquid crystal display panel 51 with a peeling auxiliary section 54a is illustrated in a second embodiment. In the following, the same numerals are attached to the components, respectively, which are shared between the first embodiment and the second embodiment, and the descriptions thereof are omitted.

Figure 6:
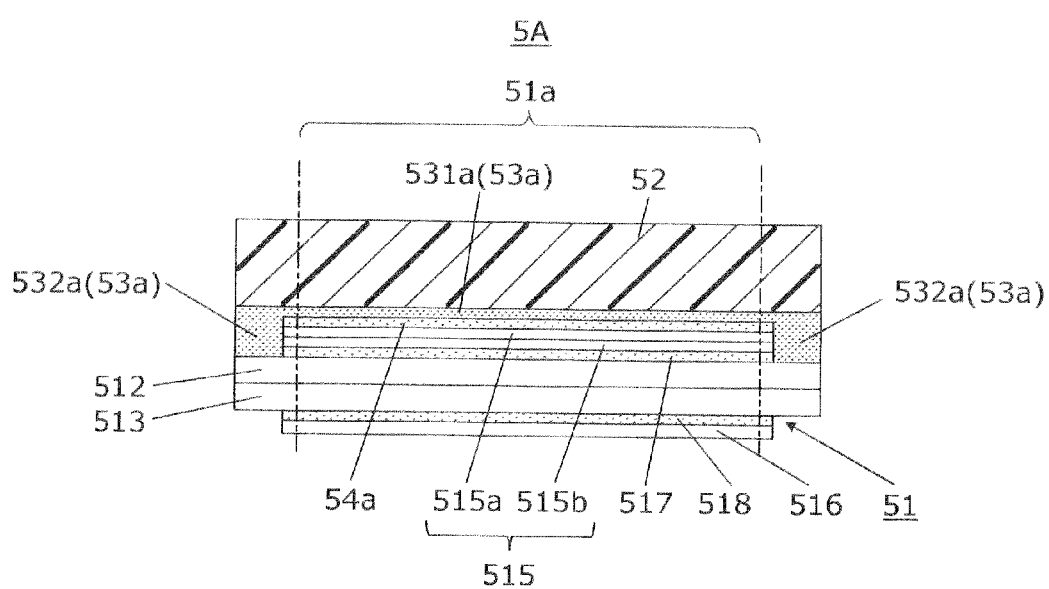
FIG. 6 is a sectional view showing the schematic configuration of the protection-plate-attached electronic member according to a second embodiment of the present invention.

FIG. 6 is a sectional view showing the schematic configuration of a protection-plate-attached electronic member 5A according to the second embodiment. As shown in FIG. 6, in the protection-plate-attached electronic member 5A, a peeling auxiliary section 54a is arranged to overlap with the whole of the optical sheet 515 of the liquid crystal display panel 51. On the other hand, an adhesion layer 53a is directly laminated on the whole of a surface of the protection plate 52, the surface which is opposed to the liquid crystal display panel 51. Consequently, apart of the adhesion layer 53a, the part which is opposed to the peeling auxiliary section 54a in a state in which the liquid crystal display panel 51 and the protection plate 52 are joined together is an overlapping section 531a of the adhesion layer 53a, and a part of the adhesion layer 53a, the part which contacts with the liquid crystal display panel 51 directly in the state in which the liquid crystal display panel 51 and the protection plate 52 are joined together is a nonoverlapping section 532a of the adhesion layer 53a.

As described above, according to the second embodiment, the peeling auxiliary section 54a is arranged to be superposed on the whole of the optical sheet 515. Consequently, a load is not easily applied to the optical sheet 515 at the time of peeling the protection plate 52, so that it is possible to prevent the optical sheet 515 from damaging.

Although the cases where each of the peeling auxiliary sections 54 and 54a is composed of one layer are described in the first and the second embodiments, respectively, peeling auxiliary sections may be provided with the protection plate 52 and the liquid crystal display panel 51, respectively. In this case, the protection plate 52 and the liquid crystal display panel 51 can be more easily peeled.

[Third Embodiment]

Although the case where the whole of the overlapping section 531 is enclosed by the nonoverlapping section 532 is illustrated in the first embodiment, a case where a part of an overlapping section is arranged on the outside of a nonoverlapping section is illustrated in a third embodiment. In the following, the same numerals are attached to the components, respectively, which are shared between the first embodiment and the third embodiment, and the descriptions thereof are omitted.

Figure 7A:
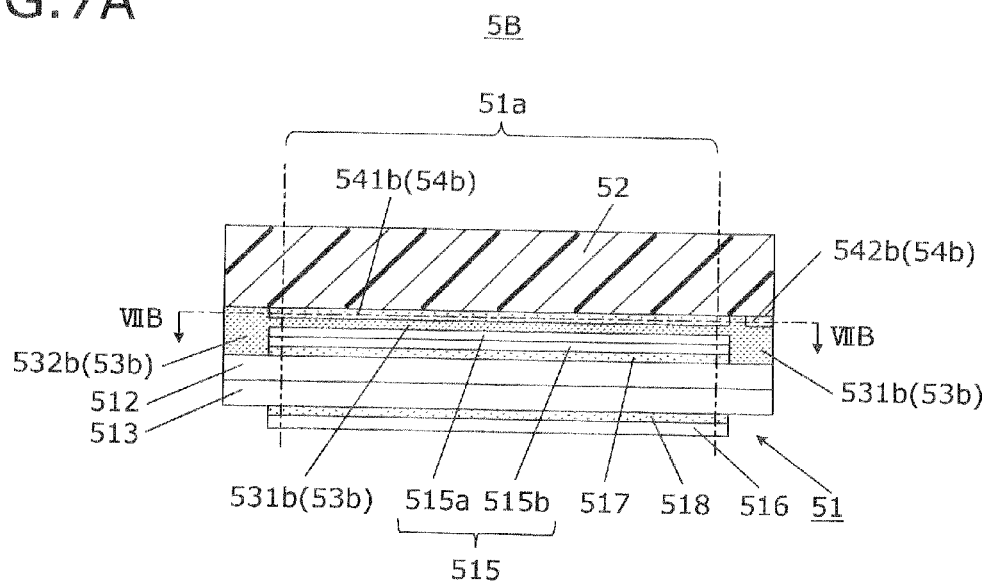
Figure 7B:
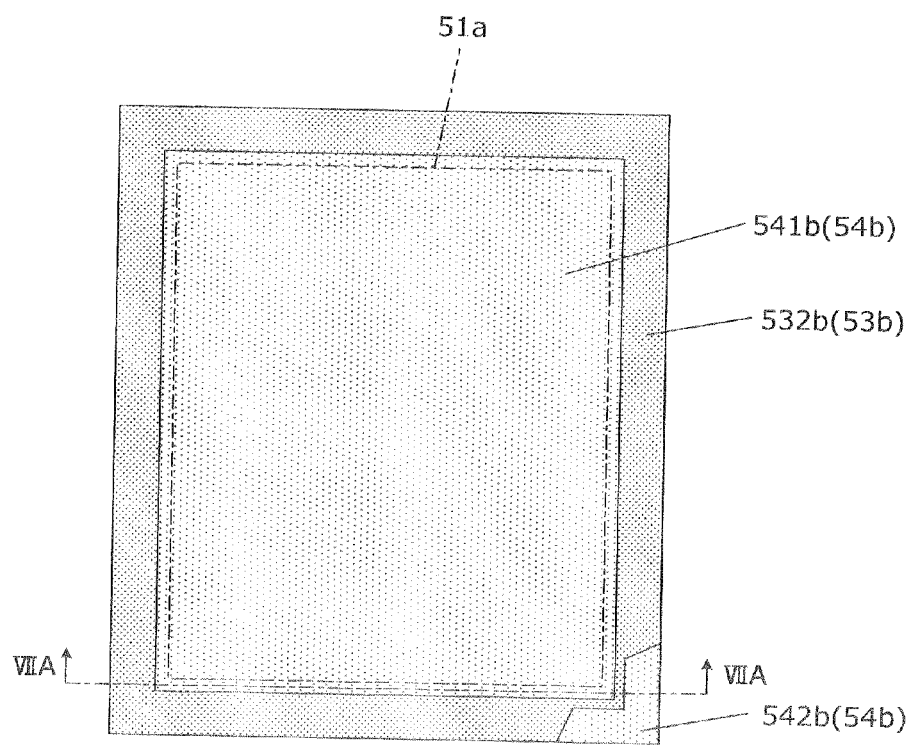

FIGS. 7A and 7B are explanatory views showing the schematic configuration of a protection-plate-attached electronic member 5B according to the third embodiment. FIG. 7A is a sectional view taken along the cutting-plane line VIIA-VIIA in FIG. 7B, and FIG. 7B is a sectional view taken along the cutting-plane line VIIB-VIIB in FIG. 7A. As shown in FIGS. 7A and 7B, a peeling auxiliary section 54b is provided with a first peeling auxiliary section 541b opposed to the optical sheet 515, and a second peeling auxiliary section 542b arranged to be separated from the first peeling auxiliary section 541b. The second peeling auxiliary section 542b is, like the first peeling auxiliary section 541b, made to intervene between an adhesion layer 53b and the protection plate 52, and arranged to be opposite to the liquid crystal display panel 51 through the adhesion layer 53b. In addition, the second peeling auxiliary section 542b is, as shown in FIG. 7B, formed in a near L-shape along two sides constituting one corner part of four corner parts of the protection plate 52, and directly contacts with the protection plate 52. A part of an overlapping section 531b of the adhesion layer 53b, the part which is opposed to the second peeling auxiliary section 542b, is referred to as a first part (second region), and a part of the overlapping section 531b of the adhesion layer 53b, the part which is opposed to the first peeling auxiliary section 541b, is referred to as a second part (first region). The first part is provided on the periphery of the adhesion layer 53b to include a part of the outer periphery of the adhesion layer 53b. The second part is provided on the central part of the adhesion layer 53b, separated from the first part, not to include the outer periphery of the adhesion layer 53b, and is formed to be in a shape of a rectangle. On the other hand, a nonoverlapping section 532b of the adhesion layer 53b is provided at a part of the adhesion layer 53b, the part which does not include the overlapping section 531b, and is formed to be in a shape of a frame so as to enclose the first part of the overlapping section 531b.

Figure 8A:
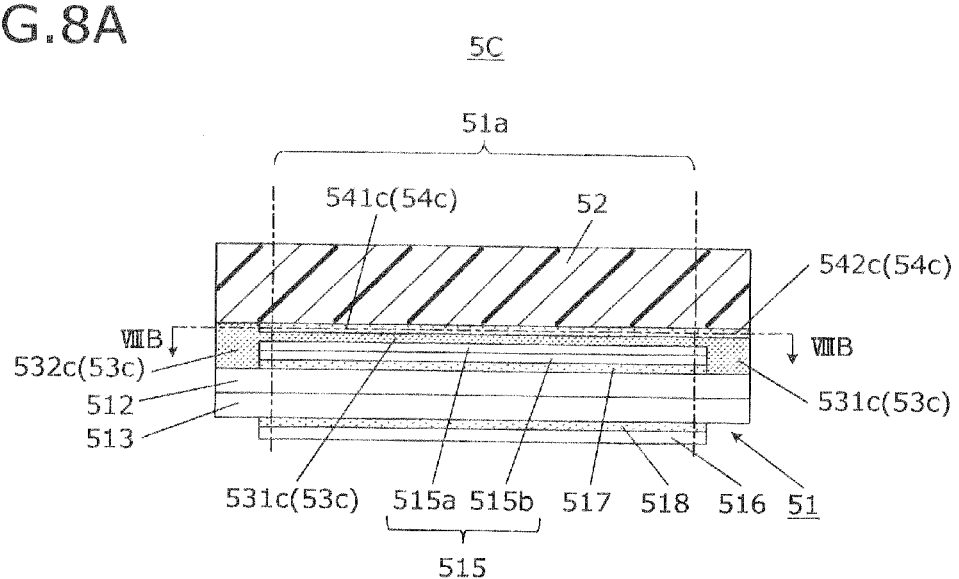
Figure 8B:
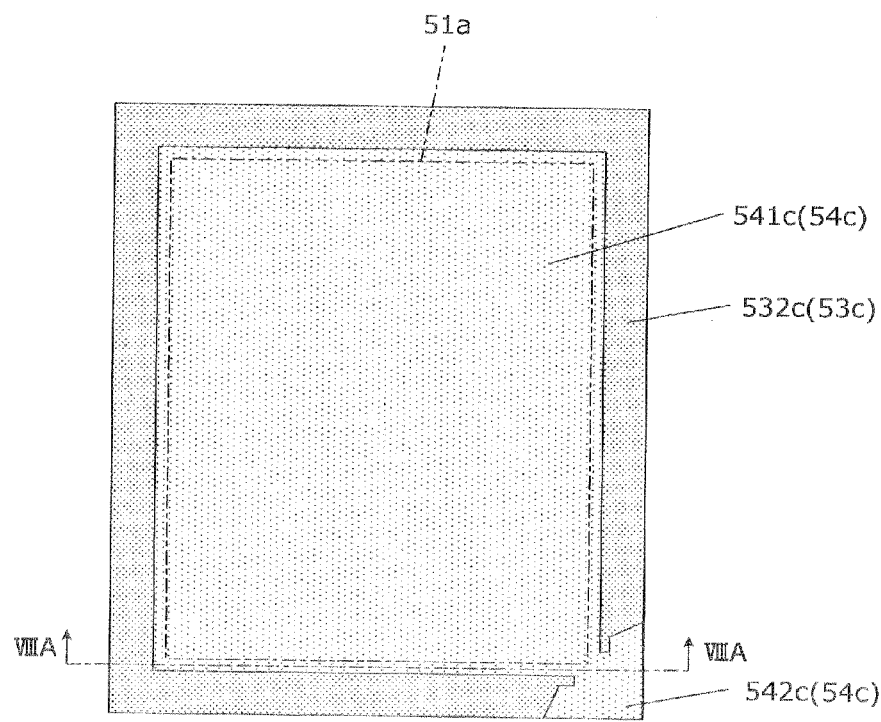

The second part may be formed to overlap with the whole of the screen area 51a of the liquid crystal display panel 51. Furthermore, as shown in FIGS. 8A and 8B, a second peeling auxiliary section 542c may be formed to be coupled to a first peeling auxiliary section 541c. FIG. 8A is a sectional view taken along the cutting-plane line VIIIA-VIIIA in FIG. 8B, and FIG. 8B is a sectional view taken along the cutting-plane line of VIIIB-VIIIB in FIG. 8A. In this case, the whole region composed of the second peeling auxiliary section 542c and the first peeling auxiliary section 541c is a first peeling auxiliary section. Namely, in this modification, a modification of the third embodiment, a nonoverlapping section 532c of an adhesion layer 53c is provided at a part of the adhesion layer 53c, the part which does not include an overlapping section 531c, so as to enclose the first part of the overlapping section 531c and to be in a shape of a frame having a gap. The overlapping section 531c has a shape in which the first peeling auxiliary section 541c and the second peeling auxiliary section 542c are connected to each other through the gap of the nonoverlapping section 532c.

As described above, according to the third embodiment, the first part whose bonding strength to the protection plate 52 is lower than the bonding strength between the nonoverlapping section 532b and the protection plate 52, is provided on the periphery of the adhesion layer 53b to include a part of the outer periphery of the adhesion layer 53b. Consequently, the liquid crystal display panel 51 and the protection plate 52 can be firmly fixed to each other at the nonoverlapping section 532b so as not to be easily separated from each other at the time of use, and also the liquid crystal display panel 51 and the protection plate 52 can be easily peeled from each other as needed at the time of manufacture by using the first part as a starting point for peeling.

The first part may be formed at a part other than the corner part. For example, the first part may be formed to include a part of one of side parts of the rectangular adhesion layer 53b, or may be formed at a plurality of corner parts and/or a plurality of side parts. In any case, it is possible to easily peel the liquid crystal display panel 51 and the protection plate 52 from each other as needed at the time of manufacture by using the first part as a starting point for peeling. Furthermore, by providing a plurality of first parts to the corner parts opposed to each other or all of the corner parts, respectively, the liquid crystal display panel 51 and the protection plate 52 can be easily peeled from each other no matter which direction the liquid crystal display panel 51 faces at the time of manufacture.

It is preferable to form a mark or the like, with which a part superposed on the first part formed on the adhesion layer 53b can be visually or tactually perceived, on the part or in the neighborhood of the part of any or all of the protection plate 52 and the transparent substrates 512 and 513. Furthermore, the mark or the like mentioned above may be formed on a part of one or both of the optical sheet 515 and the polarizing plate 516, the part which corresponds to the first part formed on the adhesion layer 53b or in the neighborhood thereof. When the first part is provided at a corner part of the adhesion layer 53b, it is preferable that the mark or the like be formed at a corner part which corresponds to the first part, or in the neighborhood of the corner part, of any or all of the protection plate 52, the transparent substrates 512 and 513, the optical sheet 515, and the polarizing plate 516.

The present invention is not limited to the embodiments described above, and can suitably be changed.

For example, although the liquid crystal display panel 51 is illuminated as a display panel in the embodiments described above, the display panel is optional as long as the display panel includes a transparent substrate. For example, an organic electroluminescence (EL) display panel and electronic paper can be used as the display panel.

In addition, as the transparent substrate, a glass substrate may be used, for example.

Although the case where the adhesion layer 53 is made of an adhesive compound is illustrated in the embodiments described above, the adhesion layer 53 may be made of a bonding agent as long as the bonding strength between the adhesion layer 53 and the protection plate 52 is higher than the bonding strength between the peeling auxiliary section 54 and the protection plate 52. The bonding agent is a liquid having liquidity at the time of bonding and resists peeling by being cured. As such a bonding agent, for example, a thermoset type bonding agent, a UV curing type bonding agent, and a moisture curing type bonding agent can be given.

Although the case where the adhesion layer 53 and the peeling auxiliary section 54 are individually formed at the time of manufacture is illustrated in the embodiments described above, the adhesion layer 53 and the peeling auxiliary section 54 may be collectively formed by sticking an adhesive sheet in which the adhesive compound constituting the adhesion layer 53 and the material constituting the peeling auxiliary section 54 are previously integrated.

Preferably, the joining strength between the protection plate 52 and the optical sheet 515 through the adhesion layer 53 be lower than the joining strength between the transparent substrate 512 and the optical sheet 515 through the optical-sheet adhesive compound 517. Hereby, it can be prevented that the optical sheet 515 is peeled with the protection plate 52 when the liquid crystal display panel 51 and the protection plate 52 are peeled from each other.

Although the liquid crystal display panel 51 is illuminated as a display panel in the embodiments, the display panel is optional as long as the display panel includes a transparent substrate. As the display panel, an organic EL display panel can be used. In this case, an organic electroluminescence light emitting layer is led to seal a gap between the pair of the transparent substrates 512 and 513.

Although the case where the first electronic member is a display panel is illustrated in the embodiments, a touch panel can be used as the first electronic member.

Moreover, the protection-plate-attached electronic member 5 may include a second electronic member. When the first electronic member is a display panel, a touch panel can be used as the second electronic member.

Figure 9:
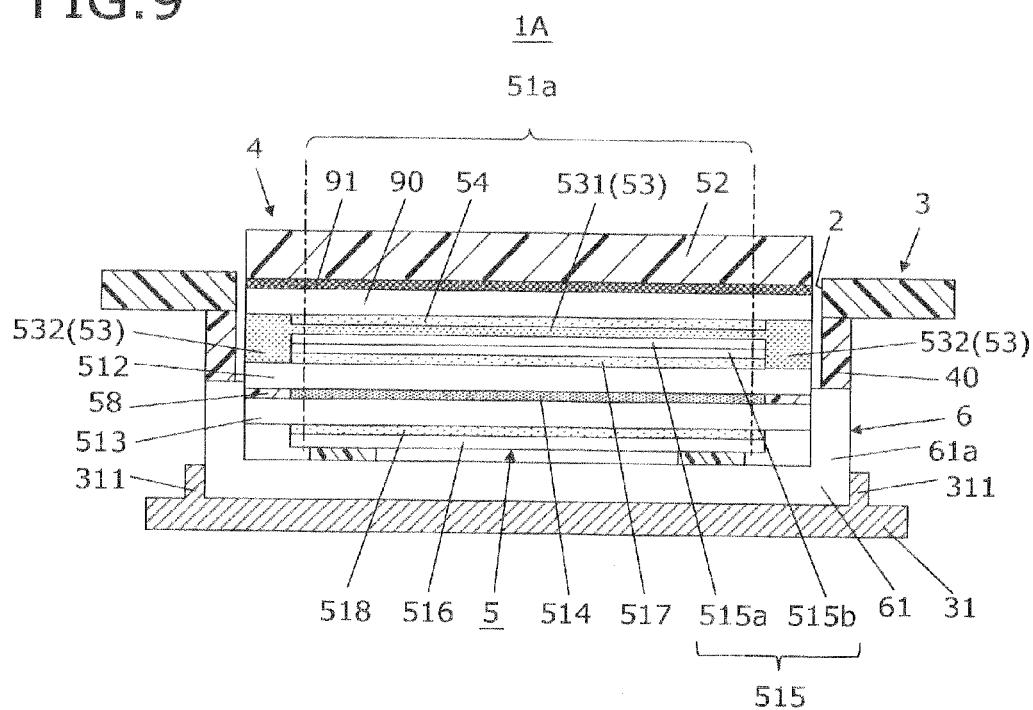
FIG. 9 is a sectional view showing the schematic configuration of the electronic apparatus in which the protectionplate-attached electronic member according to a fourth embodiment of the present invention is mounted.

FIG. 9 is a sectional view showing the schematic configuration of an electronic apparatus employing a touch panel as the second electronic member. A touch panel 90 of an electronic apparatus 1A shown in FIG. 9 is arranged to intervene between the liquid crystal display panel 51 and the protection plate 52 in a state in which the adhesion layer 53 and the peeling auxiliary section 54 intervene between the touch panel 90 and the liquid crystal display panel 51. Hereby, the liquid crystal display panel 51 is arranged on a side of the touch panel 90, the side which is opposed to a side on which the protection plate 52 is arranged. Furthermore, the protection plate 52 and the touch panel 90 are fixed to each other by an adhesion layer 91. For the touch panel 90, any one of a resistive film system, an electrostatic capacity system, an optical system, an electromagnetic induction system, and an ultrasonic wave system is used. In this embodiment, a fourth embodiment, the most part of the touch panel 90 directly contacts with the peeling auxiliary section 54, the remaining part of the touch panel 90 directly contacts with the adhesion layer 53, and the bonding strength between the touch panel 90 and the peeling auxiliary section 54 is lower than the bonding strength between the adhesion layer 53 and the peeling auxiliary section 54. Furthermore, the most part of the touch panel 90 directly contacts with the peeling auxiliary section 54, the remaining part of the touch panel 90 directly contacts with the adhesion layer 53, and the bonding strength between the touch panel 90 and the adhesion layer 53 is higher than the bonding strength between the touch panel 90 and the peeling auxiliary section 54.

Figure 10:
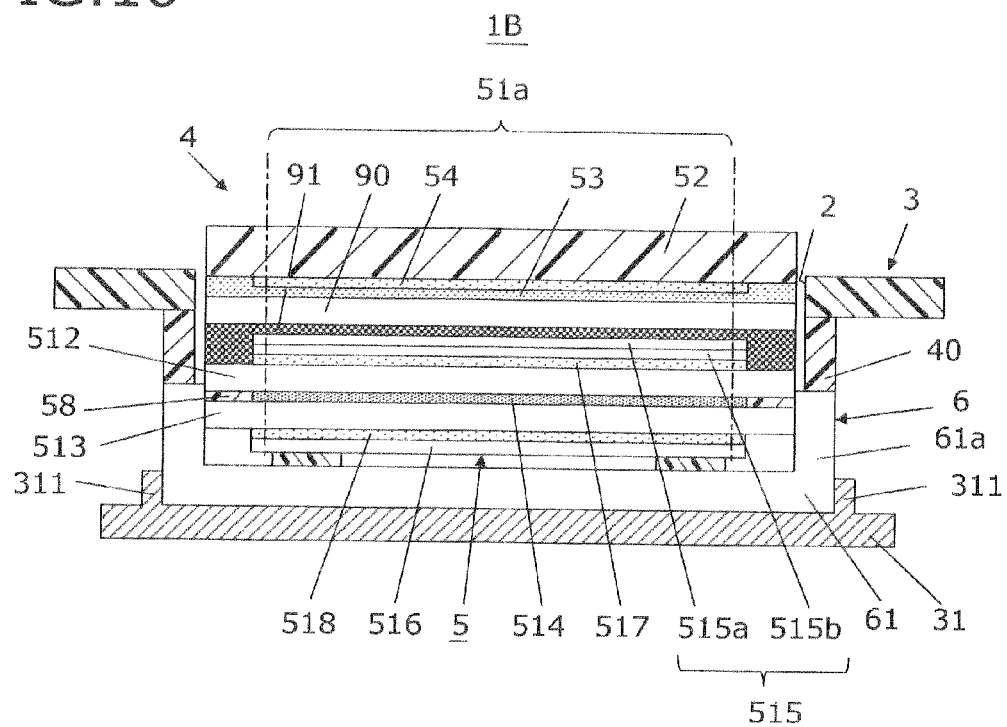
FIG. 10 is a sectional view showing the schematic configuration of the electronic apparatus in which the protection-plate-attached electronic member according to a fifth embodiment of the present invention is mounted.

FIG. 10 is a sectional view showing the schematic configuration of another electronic apparatus employing a touch panel as the second electronic member. In this embodiment, a fifth embodiment, the touch panel 90 of an electronic apparatus 1B shown in FIG. 10 is arranged to intervene between the liquid crystal display panel 51 and the protection plate 52 in a state in which the adhesion layer 53 and the peeling auxiliary section 54 intervene between the touch panel 90 and the protection plate 52. Hereby, the liquid crystal display panel 51 is arranged on a side of the touch panel 90, the side which is opposed to a side on which the protection plate 52 is arranged. Furthermore, the liquid crystal display panel 51 and the touch panel 90 are fixed to each other by the adhesion layer 91.

In the embodiments of the present invention, the touch panel 90 may be arranged instead of the protection plate 52. In this case, by using the touch panel 90 whose input surface has a high surface hardness or which has a high rigidity, the touch panel 90 can obtain a function as the protection plate 52 too. As a result, the protection plate 52 becomes unnecessary.

According to the protection-plate-attached electronic member of the embodiments of the present invention, a protection-plate-attached electronic member can be provided, the protection-plate-attached electronic member which is capable of setting the bonding strength between an electronic member such as a display panel or a touch panel and a protection plate lower in comparison with a case where only an adhesion layer intervenes between an electronic member and a protection plate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A protection-plate-attached electronic member comprising:
    a display panel including first transparent substrate;
    an adhesion layer which overlaps with the first transparent substrate;
    a protection plate fixed to the display panel in a state in which the adhesion layer intervenes between the protection plate and the first transparent substrate; and
    a peeling auxiliary section which intervenes between the adhesion layer and one of the protection plate and the display panel so as to lower bonding strength between the adhesion layer and the one of the protection plate and the display panel, wherein the adhesion layer includes:
    an overlapping section which overlaps with the peeling auxiliary section; and
    a nonoverlapping section which does not overlap with the peeling auxiliary section and which directly contacts with the one of the protection plate and the display panel.

2. The protection-plate-attached electronic member according to claim 1, wherein the nonoverlapping section is provided in such a way that a predetermined region of the nonoverlapping section encloses a first region of the overlapping section.

3. The protection-plate-attached electronic member according to claim 2, wherein the overlapping section is provided in such a way that a second region of the overlapping section includes a predetermined region on a periphery of the adhesion layer.

4. The protection-plate-attached electronic member according to claim 3, wherein the adhesion layer is in a shape including a corner part, and the second region of the overlapping section includes a corner part on the periphery of the adhesion layer.

5. The protection-plate-attached electronic member according to claim 3, wherein the adhesion layer is in a shape including a side part, and the second region of the overlapping section includes a predetermined portion of a side part on the periphery of the adhesion layer.

6. The protection-plate-attached electronic member according to claim 3, wherein a mark is formed on one of the first transparent substrate and the protection plate with which a part of the one of the first transparent substrate and the protection plate is visually or tactually perceived, the part overlapping with the second region of the overlapping section of the adhesion layer.

7. The protection-plate-attached electronic member according to claim 3, wherein the predetermined region of the nonoverlapping section is in a shape of a frame where a gap is provided in a part, and the first region and the second region of the overlapping section are connected to each other through the gap of the predetermined region of the nonoverlapping section.

8. The protection-plate-attached electronic member according to claim 3, wherein the predetermined region of the nonoverlapping section is in a shape of a continuous frame, and the first region and the second region of the overlapping section are divided by the predetermined region of the nonoverlapping section.

9. The protection-plate-attached electronic member according to claim 8, wherein the predetermined region of the nonoverlapping section includes a whole of the periphery of the adhesion layer.

10. The protection-plate-attached electronic member according to claim 1, wherein after the peeling auxiliary section is formed on a whole of a surface of the protection plate on which the adhesion layer is provided, a part of the peeling auxiliary section corresponding to the nonoverlapping section of the adhesion layer is removed.

11. The protection-plate-attached electronic member according to claim 1, wherein the adhesion layer and the peeling auxiliary section have a same refraction index.

12. The protection-plate-attached electronic member according to claim 1, wherein the overlapping section overlaps with a whole of a screen area of the display panel.

13. The protection-plate-attached electronic member according to claim 1, wherein the peeling auxiliary section intervenes between the adhesion layer and the one of the protection plate and the display panel in a state in which the peeling auxiliary section directly contacts with one of the adhesion layer and the one of the protection plate and the display panel.

14. The protection-plate-attached electronic member according to claim 1, further comprising:
    an electronic member provided between the protection plate and the adhesion layer, wherein
    the peeling auxiliary section intervenes between the adhesion layer and one of the display panel and the electronic member in a state in which the peeling auxiliary section directly contacts with one of the adhesion layer and the one of the display panel and the electronic member.

15. The protection-plate-attached electronic member according to claim 1, wherein a bonding strength between the peeling auxiliary section and the protection plate is lower than a bonding strength between the adhesion layer and the protection plate.

16. The protection-plate-attached electronic member according to claim 1, wherein a bonding strength between the adhesion layer and the peeling auxiliary section is lower than a bonding strength between the adhesion layer and the protection plate.

17. The protection-plate-attached electronic member according to claim 1, wherein the peeling auxiliary section includes one of a water repellent agent and a mold releasing agent.

18. The protection-plate-attached electronic member according to claim 1, wherein the display panel further includes:
    a second transparent substrate attached to the first transparent substrate through a liquid crystal layer; and
    an optical sheet attached to the second transparent substrate so as to overlap with a whole of a screen area of the display panel in a state in which the second transparent substrate intervenes between the optical sheet and the first transparent substrate,
    wherein the display panel comprises a liquid crystal display panel.

19. The protection-plate-attached electronic member according to claim 18, wherein the peeling auxiliary section overlaps with a whole of the optical sheet.

20. The protection-plate-attached electronic member according to claim 18, wherein a joining strength between the optical sheet and the protection plate through the adhesion layer is lower than a joining strength between the optical sheet and the second transparent substrate through an optical sheet adhesive compound which fixes the optical sheet and the second transparent substrate to each other.

21. The protection-plate-attached electronic member according to claim 18, wherein the optical sheet includes:
    a polarizing plate; and
    a phase plate, wherein
    one of the polarizing plate and the phase plate is superposed on the other of the polarizing plate and the phase plate.

22. The protection-plate-attached electronic member according to claim 18, further comprising:
 a surface light source for radiating an illumination light to the liquid crystal display panel,
 wherein the surface light source which is provided on a side of the liquid crystal display panel the side opposite to a side on which the protection plate is provided.

23. The protection-plate-attached electronic member according to claim 1, wherein the display panel further includes: a second transparent substrate attached to the first transparent substrate through an organic electroluminescence light emitting layer,
 wherein the is display panel comprises an organic electroluminescence display panel.

24. The protection-plate-attached electronic member according to claim 1, wherein the display panel comprises a touch panel, and the touch panel uses one of a resistive film system, an electrostatic capacity system, an optical system, an electromagnetic induction system, and an ultrasonic wave system.

25. The protection-plate-attached electronic member according to claim 24, wherein the display panel is provided on a side of the touch panel opposite to a side on which the protection plate is provided.

* * * * *